US012628513B2

(12) United States Patent
Wang

(10) Patent No.: US 12,628,513 B2
(45) Date of Patent: May 12, 2026

(54) FLEXIBLE DISPLAY PANEL INCLUDING ISLAND STRUCTURES CONNECTED AND STRETCHED THROUGH ELECTRICAL CONNECTING STRUCTURES, MANUFACTURING METHOD THEREOF, AND DISPLAY TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Zuojia Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 767 days.

(21) Appl. No.: 17/758,074

(22) PCT Filed: May 30, 2022

(86) PCT No.: PCT/CN2022/095981
§ 371 (c)(1),
(2) Date: Jun. 28, 2022

(87) PCT Pub. No.: WO2023/226059
PCT Pub. Date: Nov. 30, 2023

(65) Prior Publication Data
US 2024/0179965 A1    May 30, 2024

(30) Foreign Application Priority Data
May 23, 2022    (CN) .......................... 202210560268.5

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/124* (2023.02); *H10K 2102/311* (2023.02)

(58) Field of Classification Search
None
See application file for complete search history.

(56) References Cited

U.S. PATENT DOCUMENTS

2020/0144522 A1    5/2020   Jung
2020/0161276 A1*   5/2020   Kim ........................... G09F 9/33

FOREIGN PATENT DOCUMENTS

CN    110459571 A    11/2019
CN    110494985 A    11/2019
(Continued)

OTHER PUBLICATIONS

International Search Report in International application No. PCT/CN2022/095981, mailed on Nov. 28, 2022.
(Continued)

*Primary Examiner* — Daniel Whalen
(74) *Attorney, Agent, or Firm* — PV IP PC; Christopher S. Ruprecht; Wei Te Chung

(57) ABSTRACT

A flexible display panel, a manufacturing method thereof, and a display terminal are provided in the present application. The flexible display panel includes a plurality of island structures, a plurality of electrical connecting structures, and a first flexible adhesive layer. The first flexible adhesive layer is filled between the plurality of island structures and covers the plurality of island structures. A ratio of a difference between a second distance of adjacent two of the island (Continued)

structures in a stretched state and a first distance in an unstretched state to the first distance ranges from 10% to 20%.

16 Claims, 11 Drawing Sheets

(51) Int. Cl.
H10K 59/124 (2023.01)
H10K 102/00 (2023.01)

(56) References Cited

FOREIGN PATENT DOCUMENTS

| CN | 110603644 A | 12/2019 |
|----|-------------|---------|
| CN | 110851028 A | 2/2020 |
| CN | 112397457 A | 2/2021 |
| CN | 112397559 A | 2/2021 |
| CN | 113724590 A | 11/2021 |
| CN | 113780179 A | 12/2021 |
| CN | 114361224 A | 4/2022 |
| WO | 2022017026 A1 | 1/2022 |

OTHER PUBLICATIONS

Written Opinion of the International Search Authority in International application No. PCT/CN2022/095981, mailed on Nov. 28, 2022.
Chinese Office Action issued in corresponding Chinese Patent Application No. 202210560268.5 dated Dec. 26, 2022, pp. 1-9.

* cited by examiner

100

M 350
220
202
201
360

X2

370
350
220
202
201
360
370

X3

340
310
220
202
201
330

320
340
310
220
202
201
330
320

200

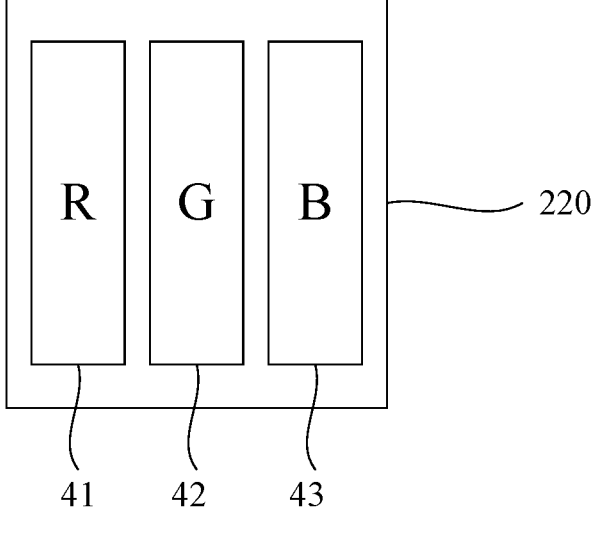

R     G     B          — 220

41     42     43

FIG. 12 forming a stripping layer on a rigid substrate;                                                                    S10 forming a plurality of island structures comprising a light-emitting unit on the stripping layer,     S20
and the plurality of island structures are arranged separately;

forming a first flexible adhesive layer on the plurality of island structures to form a flexible     S30
display body;

separating the flexible display body from the stripping layer;                                          S40 forming a second flexible adhesive layer on either side of the flexible display body.          S50

FIG. 13

FLEXIBLE DISPLAY PANEL INCLUDING ISLAND STRUCTURES CONNECTED AND STRETCHED THROUGH ELECTRICAL CONNECTING STRUCTURES, MANUFACTURING METHOD THEREOF, AND DISPLAY TERMINAL

BACKGROUND OF DISCLOSURE

Technical Field

The present disclosure relates to a technical field of displays, and in particular, to a flexible display panel, a manufacturing method thereof, and a display terminal.

Description of Prior Art

Based on a display technology of flexible organic light emitting diodes (OLEDs), a stretchable display technology will be a key research direction of a next generation display technology. Essence of the stretchable display technology is to realize flexibility of a screen itself. Through a flexible design of a display backplane, that is, a backplane material is hollowed out in a way of patterned design, a display panel can be stretched and deformed in any direction based on an original area, so as to realize stretchable and expandable display.

However, due to high-resolution requirements of the display panel, an area of the display panel that can be hollowed out is limited, that is, an area of perforating in a flexible layer has an upper limitation, which makes a stretching ratio of an existing stretchable display panel unable to be further improved.

Therefore, a flexible display panel, a manufacturing method thereof, and a display terminal are urgently needed to solve the above-mentioned technical problems.

BRIEF SUMMARY OF DISCLOSURE

Technical Problem

A flexible display panel, a manufacturing method thereof, and a display terminal are provided in the present application, so as to alleviate a technical problem that a stretching ratio of an existing stretchable display panel is small.

Technical Solutions

A flexible display panel is provided in the present application, which comprises:

a plurality of island structures comprising a plurality of light emitting units, and the plurality of island structures arranged separately;

a plurality of electrical connecting structures, the electrical connecting structures comprising metal lines electrically connected to the light-emitting units;

adjacent ones of the island structures are stretched and connected through the plurality of electrical connecting structures; and a first flexible adhesive layer filled between the plurality of island structures, and the first flexible adhesive layer covering the plurality of island structures;

wherein when the flexible display panel is in an unstretched state, a distance between adjacent two of the island structures is a first distance; when the flexible display panel is in a stretched state, the distance between the adjacent two of the island structures is a second distance; and a ratio of a difference between the second distance and the first distance to the first distance ranges from 10% to 20%.

A manufacturing method of the flexible display panel is further provided in the present application, which comprises:

forming a stripping layer on a rigid substrate;

forming a plurality of island structures comprising a plurality of light-emitting units on the stripping layer; the plurality of island structures are arranged separately;

forming a first flexible adhesive layer on the plurality of island structures to form a flexible display body; the first flexible adhesive layer is filled between the plurality of island structures, and the first flexible adhesive layer covers the plurality of island structures;

separating the flexible display body from the stripping layer; and forming a second flexible adhesive layer on either side of the flexible display body to form a flexible display panel;

wherein when the flexible display panel is in an unstretched state, a distance between adjacent two of the island structures is a first distance; when the flexible display panel is in a stretched state, the distance between the adjacent two of the island structures is a second distance; a ratio of a difference between the second distance and the first distance to the first distance ranges from 10% to 20%.

A display terminal is further provided in the present application, the display terminal comprises a terminal body and a flexible display panel, the terminal body and the flexible display panel are combined into a whole, and the flexible display panel comprises:

a plurality of island structures comprising a plurality of light emitting units, and the plurality of island structures arranged separately;

a plurality of electrical connecting structures, the electrical connecting structures comprising metal lines electrically connected to the light-emitting units;

adjacent ones of the island structures are stretched and connected through the plurality of electrical connecting structures; and a first flexible adhesive layer filled between the plurality of island structures, and the first flexible adhesive layer covering the plurality of island structures;

wherein when the flexible display panel is in an unstretched state, a distance between adjacent two of the island structures is a first distance; when the flexible display panel is in a stretched state, the distance between the adjacent two of the island structures is a second distance; and a ratio of a difference between the second distance and the first distance to the first distance ranges from 10% to 20%.

The first flexible adhesive layer is provided between the adjacent two of the island structures and on the island structures in the present application, through shrinkage of the flexible adhesive layer, the distance between the adjacent two of the island structures in the unstretched state is reduced while ensuring that overall stretching volume remains unchanged, increasing a stretching area of the flexible display panel from a shrinking state to the stretched state and improving a stretching ratio of the flexible display panel.

BRIEF DESCRIPTION OF DRAWINGS

FIG. 12 is a third enlarged view of the area M in FIG. 1.

FIG. 13 is a process step diagram of the flexible display panel in the present application.

DETAILED DESCRIPTION OF PREFERRED EMBODIMENTS

Figure 1:
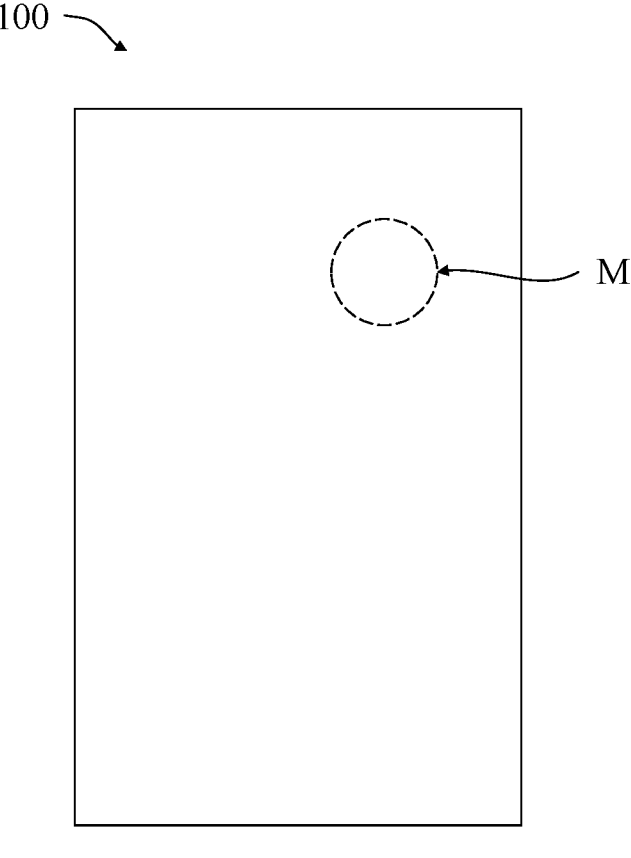
FIG. 1 is a top structural view of a flexible display panel in the present application.

Purpose, technical solutions, and technical effects will be clearly and more explicitly described below with reference to drawings in embodiments of the present application. It should be understood that specific embodiments described here are intended to explain the present application only and are not intended to limit the present application.

Due to high-resolution requirements of a display panel, an area of the display panel that can be hollowed out is limited, that is, an area of perforating in a flexible layer has an upper limitation, which makes a stretching ratio of an existing stretchable display panel unable to be further improved. Following technical solutions are proposed in the present application to solve the above-mentioned technical problems.

Please refer to FIGS. 1 to 12, a flexible display panel 100 is provided in the present application and includes a plurality of island structures 20, a plurality of electrical connecting structures 10, and a first flexible adhesive layer 310. The plurality of island structures 20 are separately arranged. And each island structure 20 is provided with a light-emitting unit 220. The first flexible adhesive layer 310 is filled between the plurality of island structures 20, and the first flexible adhesive layer 310 covers the plurality of island structures 20.

In the embodiment, the electrical connecting structures 10 include metal lines electrically connected to the light-emitting units 220. Adjacent island structures 20 are stretched and connected through the plurality of electrical connecting structures 10.

In the embodiment, when the flexible display panel 100 is in an unstretched state, a distance between adjacent two island structures 20 is a first distance L1; when the flexible display panel 100 is in a stretched state, the distance between the adjacent two island structures 20 is a second distance L2. A ratio of a difference between the second distance L2 and the first distance L1 to the first distance L1 ranges from 10% to 20%.

The first flexible adhesive layer 310 is provided between the adjacent two island structures 20 and on the island structures 20 in the present application, and through shrinkage of the flexible adhesive layer, the distance between the adjacent two island structures 20 in the unstretched state is reduced while ensuring that overall stretching volume remains unchanged, increasing a stretching area of the flexible display panel 100 from a shrinking state to the stretched state and improving a stretching ratio of the flexible display panel 100.

Figure 2:
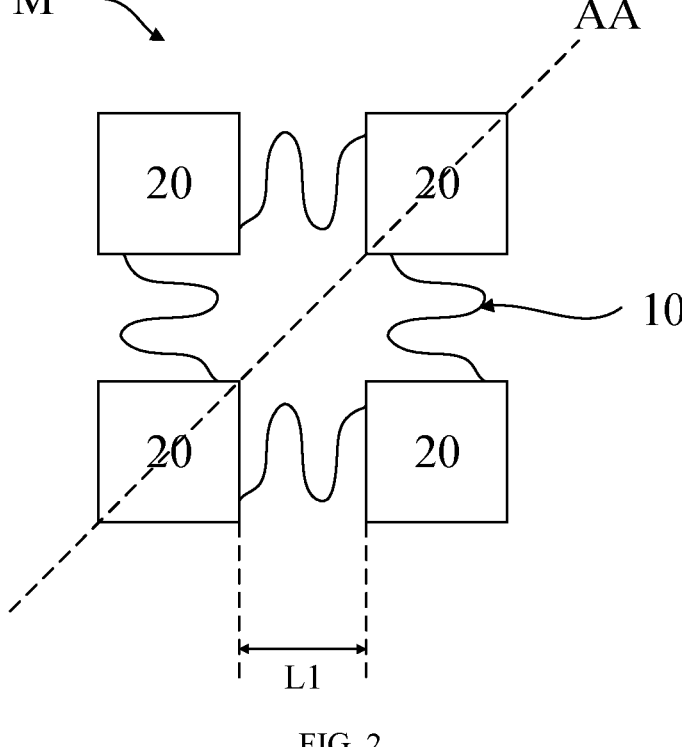
FIG. 2 is a first enlarged view of an area M in FIG. 1.

Please refer to FIG. 2, FIG. 2 is a first enlarged view of an area M in FIG. 1. A structure shown in FIG. 2 is a structural diagram of the flexible display panel 100 when the flexible display panel 100 is in the unstretched state. The distance between the adjacent two island structures 20 is the first distance L1. The first distance L1 may be a minimum shrinking distance of the adjacent two island structures 20.

Figure 3:
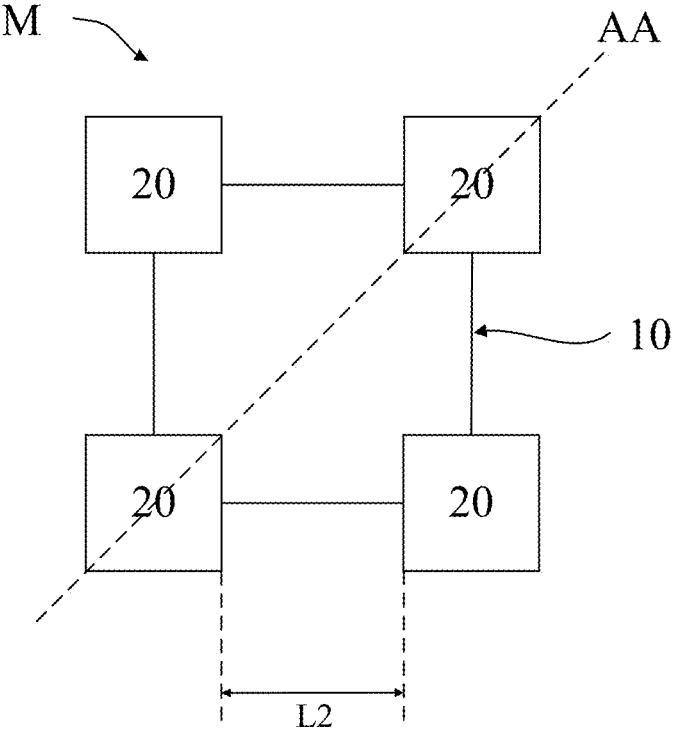
FIG. 3 is a second enlarged view of the area M in FIG. 1.

Please refer to FIG. 3, FIG. 3 is a second enlarged view of the area M in FIG. 1. A structure shown in FIG. 3 is a structural diagram of the flexible display panel 100 when the flexible display panel 100 is in the stretched state. The distance between the adjacent two island structures 20 is the second distance L2. The second distance L2 may be a maximum stretching distance of the adjacent two island structures 20.

It should be noted that the ratio of the difference between the second distance L2 and the first distance L1 to the first distance L1 ranges from 10% to 20%. The distance between the adjacent two island structures 20 in the stretched state is greater than the distance between the adjacent two island structures 20 in the shrinking state, which increases the stretching area of the flexible display panel 100 from the shrinking state to the stretched state and improves a stretching ratio of the flexible display panel 100.

A technical scheme of the present application is now described in combination with specific embodiments.

Figure 4:
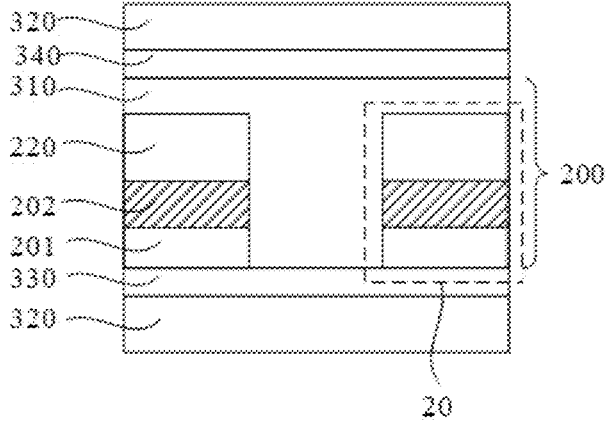
FIG. 4 is a first cross-sectional view of a section AA shown in FIG. 2 or FIG. 3.

Please refer to FIG. 4, FIG. 4 is a first cross-sectional view of a section AA shown in FIG. 2 or FIG. 3. The flexible display panel 100 includes a flexible display body 200 and an encapsulation structure located on either side of the flexible display body 200.

In the embodiment, the flexible display body 200 includes a plurality of island structures 20 and a first flexible adhesive layer 310 filled between the plurality of island structures 20. And the first flexible adhesive layer 310 covers the plurality of island structures 20.

Figure 5:
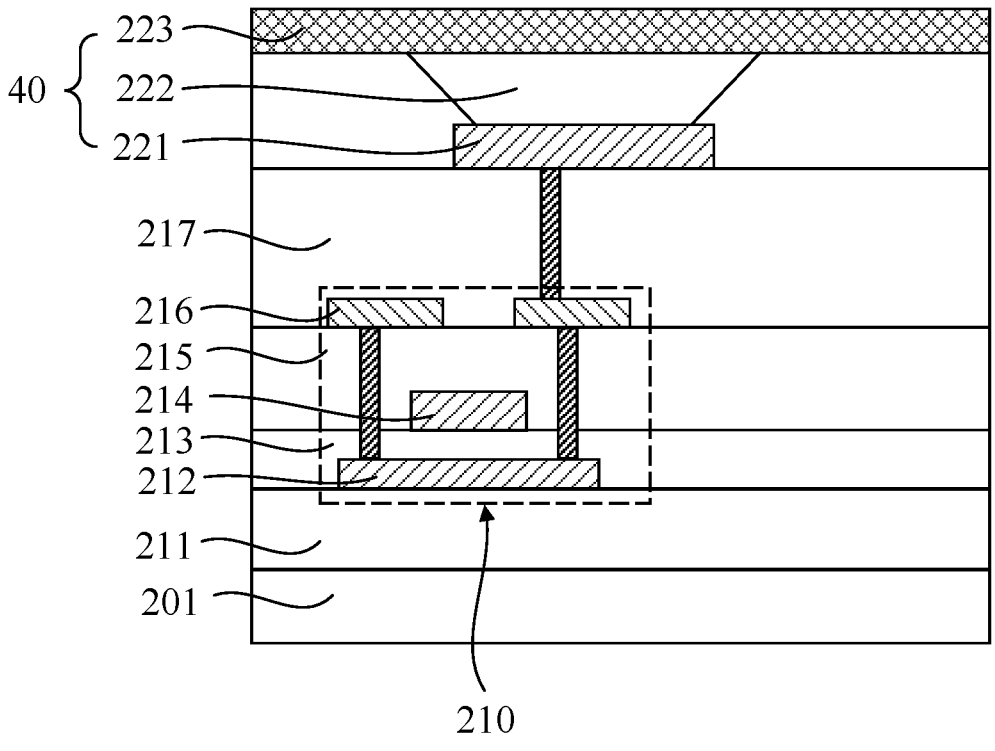
FIG. 5 is a first film structural diagram of island structures in FIG. 2 or FIG. 3.
Figure 6:
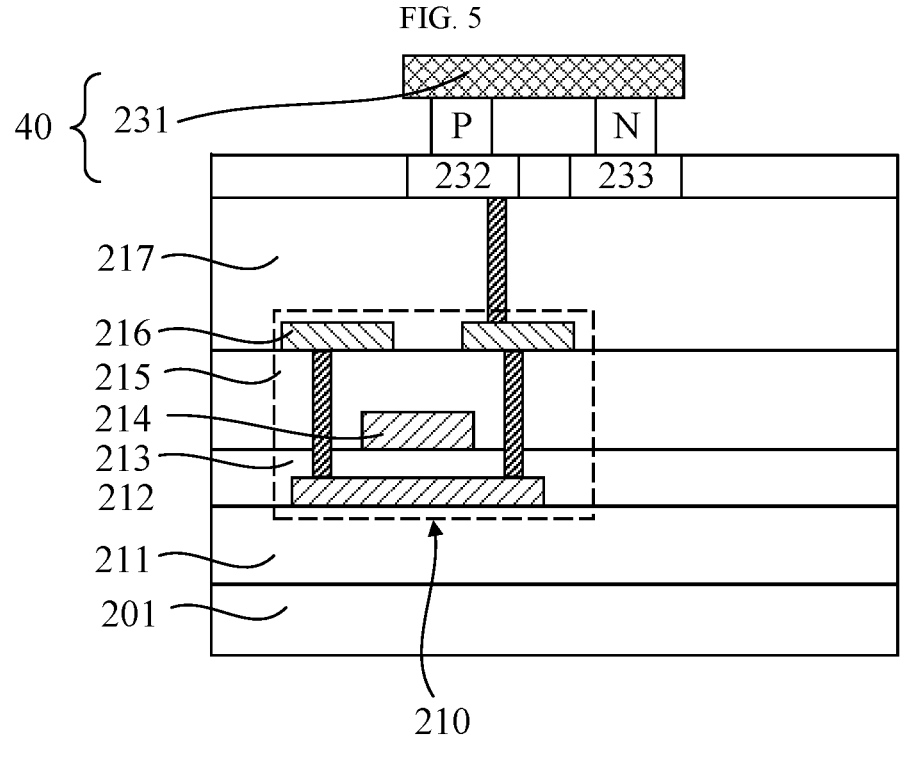
FIG. 6 is a second film structural diagram of the island structures in FIG. 2 or FIG. 3.

Please refer to FIG. 5 and FIG. 6, FIG. 5 is a first film structural diagram of the island structures 20 in FIG. 2 or FIG. 3; FIG. 6 is a second film structural diagram of the island structures 20 in FIG. 2 or FIG. 3.

In the embodiment, the island structures 20 may include a flexible substrate 201, an array driving layer 202 arranged on the flexible substrate 201, and a light-emitting functional layer 40 arranged on the array driving layer 202. The flexible substrate 201, the array driving layer 202, and the light-emitting functional layer 40 are patterned to form light-guiding channels between adjacent island structures 20. The light-guiding channels are filled by the first flexible adhesive layer 310.

In the embodiment, a material of the flexible substrate 201 may be made of one of polyurethane rubber, acrylic acid, silicone rubber, or polyimide, and has good stretchable properties.

In the embodiment, the array driving layer 202 may include a plurality of thin film transistors 210. The thin film transistor 210 may have a structure such as an etch barrier type, a back channel etch type, or a top gate thin film transistor type, which is not specifically limited. For example, the top gate thin film transistor is taken as an example, the thin film transistor 210 may include a buffer layer 211 located on the flexible substrate 201, an active layer 212 located on the buffer layer 211, a gate insulating layer 213 located on the active layer 212, a gate layer 214 located on the gate insulating layer 213, an inter-insulating layer 215 located on the gate layer 214, a source-and-drain layer 216 located on the inter-insulating layer 215, and a planarization layer 217 located on the source-and-drain layer 216.

In the embodiment, the above-mentioned top gate thin film transistor is not limited to a single-gate structure, but can also be set as a double-gate structure or the like.

In the embodiment, the active layer 212 may be one of low temperature polysilicon, indium gallium zinc oxide, or amorphous silicon. Structures in FIG. 5 and FIG. 6 are illustrated by taking the indium gallium zinc oxide as an example.

In the embodiment, the light-emitting functional layer 40 includes a plurality of light-emitting units 220. The light-emitting units 220 may be organic light emitting diodes (OLEDs) or micro light emitting diodes (micro-LEDs). For example, in the structure of FIG. 5, the light-emitting units 220 may be the OLEDs. The light-emitting functional layer 40 may include an anode layer 221, a light-emitting material layer 222, and a cathode layer 223; and the anode layer 221 is electrically connected to the source-and-drain layer 216. Alternatively, for example, in the structure of FIG. 6, the light-emitting units 220 may be the micro-LEDs; and the light-emitting functional layer 40 may include a first electrode 232 and a second electrode 233. The first electrode 232 is electrically connected to the source-and-drain layer 216 and a p-type electrode of a light-emitting member 231, and the second electrode 233 is electrically connected to an n-type electrode of the light-emitting member 231.

In the embodiment, please refer to FIG. 4, a material of the first flexible adhesive layer 310 may include polydimethylsiloxane (PDMS). The PDMS generally uses a main agent and a hardener to mix evenly in a mass ratio of 10:1, and a corresponding chemical formula is $nSi(CH_3)_2Cl_2 + nH_2O \rightarrow [Si(CH_3)_2O]_n + 2nHCl$. Secondly, mixed liquid is spin-coated between the plurality of island structures 20 and covers the plurality of island structures 20, and bubbles in the mixed liquid are stripped and cured in a high-temperature environment. For example, the bubbles in the mixed liquid can be made floating to a surface by means of vacuuming for defoaming, and a defoaming material body can be baked in an oven at 120° C. for 1 h. A baking time is positively related to hardness of the first flexible adhesive layer 310, and therefore, the baking time can be set according to requirements.

In the flexible display panel 100 of the present application, the flexible display panel 100 further includes a second flexible adhesive layer 320 arranged on either side of the flexible display panel 100. The second flexible adhesive layer 320 is adhered to a surface of a backlight side of the flexible display panel 100 through a first adhesive layer 330. And the second flexible adhesive layer 320 is adhered to a surface of a light-emitting side of the flexible display panel 100 through a second adhesive layer 340.

In the embodiment, a material of the second flexible adhesive layer 320 is same as the material of the first flexible adhesive layer 310.

In the embodiment, the first adhesive layer 330 and the second adhesive layer 340 may be optically clear adhesive (OCA) adhesive.

Please refer to FIGS. 7a to 7d, FIGS. 7a to 7d are process flow diagrams of a flexible display panel in the prior art.

Please refer to FIGS. 8a to 8d, FIGS. 8a to 8d are first process flow diagrams of the flexible display panel 100 in the present application.

Figure 7A:
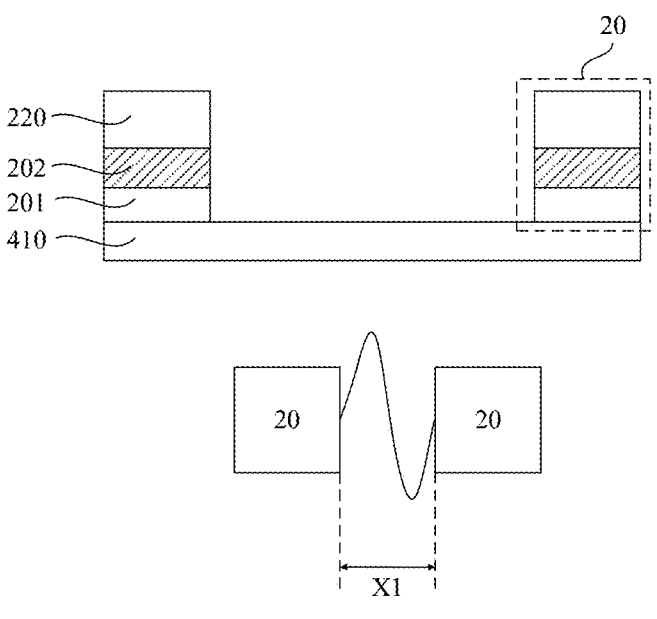
FIGS. 7a to 7d are process flow diagrams of a flexible display panel in prior art.
Figure 7A:
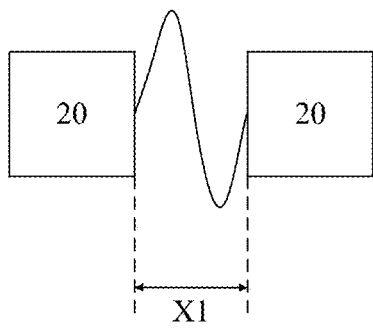
Figure 7B:
Figure 7C:
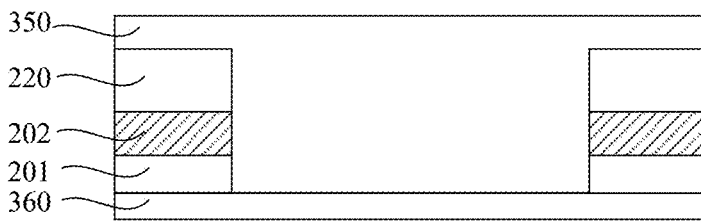
Figure 7C:
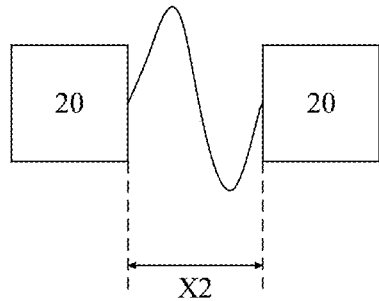
Figure 7D:
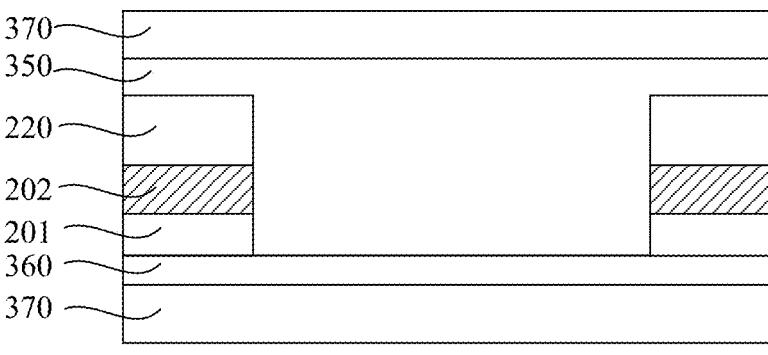
Figure 7D:
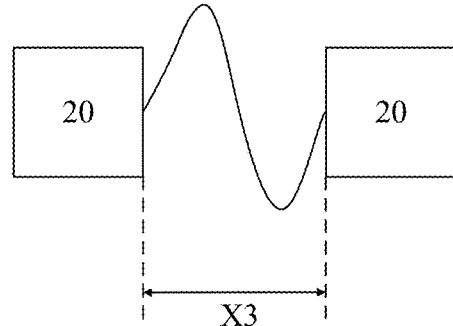

In FIG. 7a, forming a plurality of island structures 20 on a rigid substrate 410. In FIG. 7b, separating the rigid substrate 410 from the plurality of island structures 20 on an upper layer; the island structures 20 may include a flexible substrate 201, an array driving layer 202, and a light-emitting functional layer 40; a distance between adjacent two island structures 20 may be X1. In FIG. 7c, filling a first OCA adhesive layer 350 between the plurality of island structures 20 and covering the plurality of island structures 20 with the OCA adhesive; at a same time, a second OCA adhesive layer 360 is also formed on sides of the plurality of island structures facing away from a light-emitting unit 220; due to flexibility of the OCA adhesive, the distance between the adjacent two island structures 20 can be X2. In FIG. 7d, forming an encapsulation adhesive layer 370 on either side of the structure in FIG. 7c, and a material of the encapsulation adhesive layer can be PDMS. Since the PDMS needs to be pressed for adhering, the distance between the adjacent two island structures 20 can be X3. Therefore, in a manufacturing process of an existing flexible display panel 100, the plurality of island structures 20 are separated from the rigid substrate 410 first, and then the OCA and PDMS are adhered. The distance between the adjacent two island structures 20 is changed from X1 to X2 and to X3.

It should be noted that although the flexible substrate 201 in FIG. 7b is separated, in an actual top view structure, the flexible substrate 201 is in a mesh structure, and adjacent two flexible substrates 201 are also connected by branches.

Figure 8A:
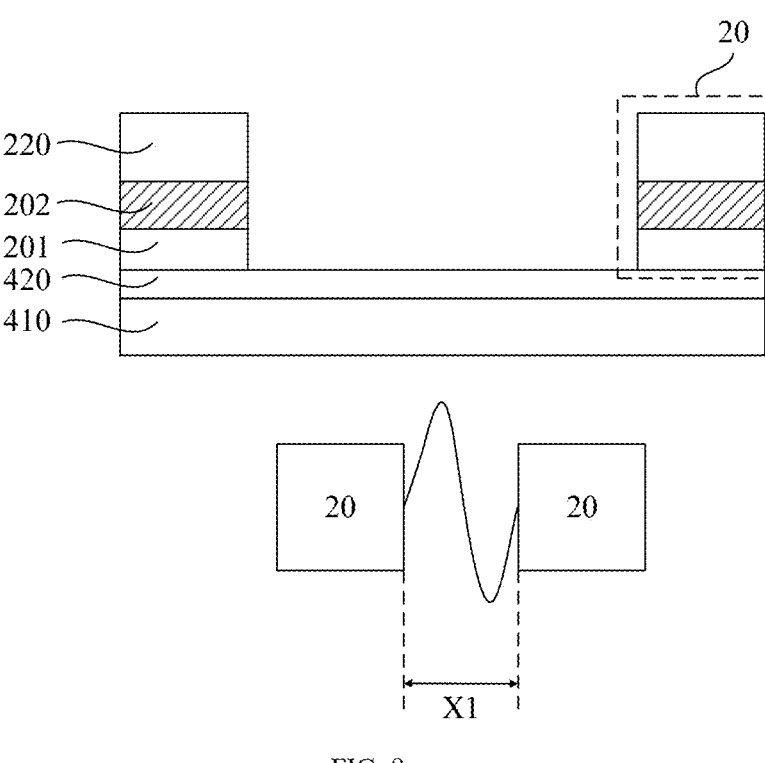
FIGS. 8a to 8d are first process flow diagrams of a flexible display panel in the present application.
Figure 8B:
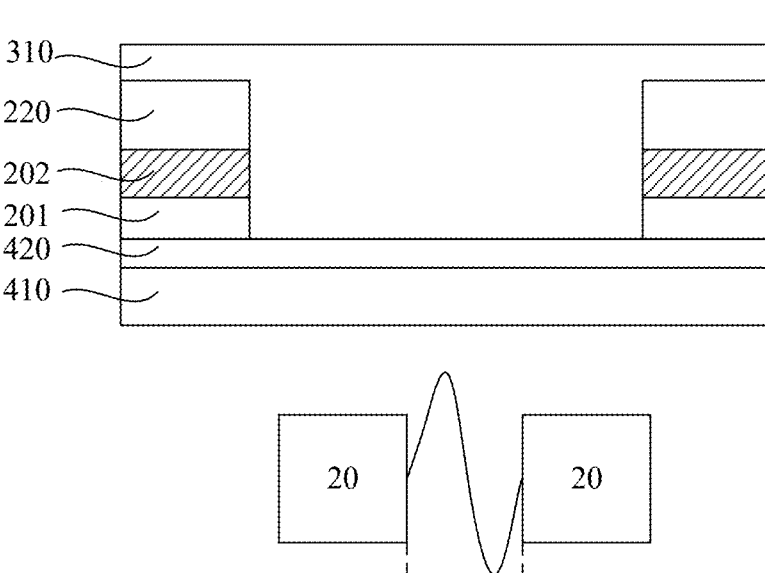
Figure 8C:
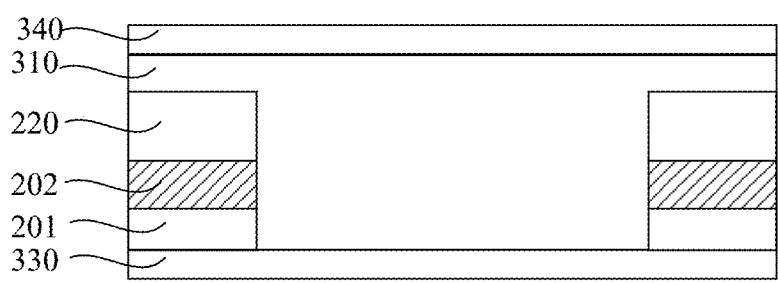
Figure 8C:
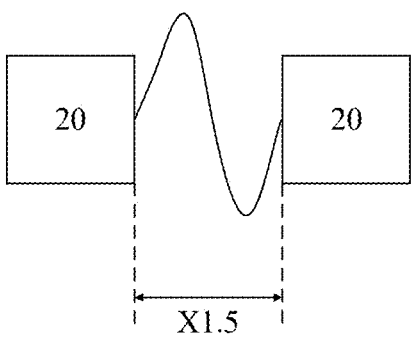
Figure 8D:
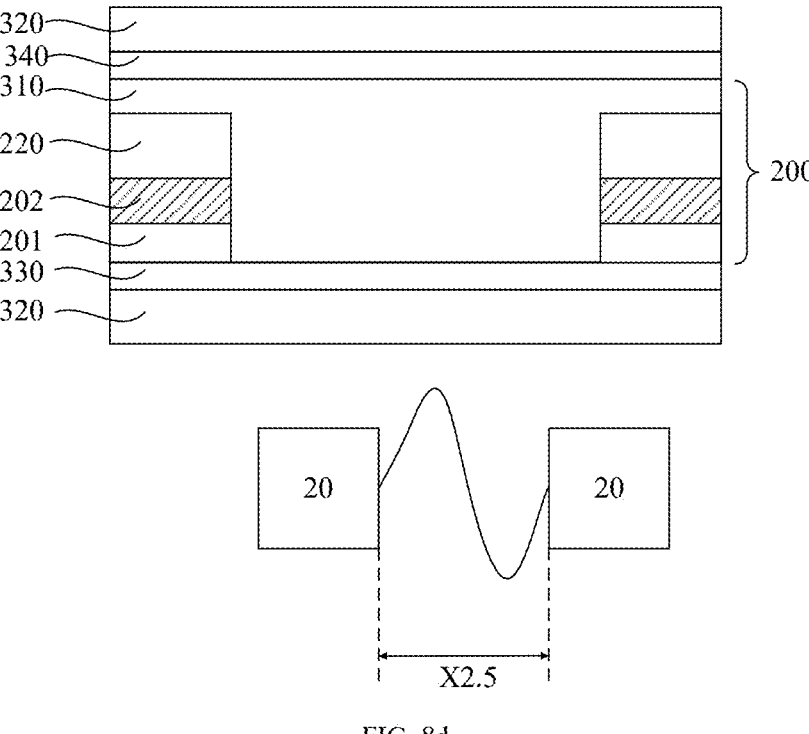

In FIG. 8a, forming a stripping layer 420 on a rigid substrate 410 and forming a plurality of island structures 20 on the stripping layer 420. In FIG. 8b, coating a PDMS material between the plurality of island structures 20 and covering the plurality of island structures 20 with the PDMS material. Since the rigid substrate 410 has not been stripped, a distance between adjacent two island structures 20 may be X1. In FIG. 8c, separating the structure of FIG. 8b from the rigid substrate 410 and forming an OCA adhesive layer on either side of a flexible display body 200 at a same time. Since the OCA needs to be pressed for adhering, the distance between the adjacent two island structures 20 can be X1.5. In FIG. 8d, forming a PDMS layer on either side of the structure of FIG. 8c. Since the PDMS needs to be pressed for adhering, the distance between the adjacent two island structures 20 can be X2.5. Therefore, in a manufacturing process of the flexible display panel 100 of the present application, the PDMS layer is firstly formed between the plurality of island structures 20, then the flexible display body 200 is separated from the rigid substrate 410, and then the OCA and the PDMS are adhered. The distance between the adjacent two island structures 20 is changed from X1 to X1.5 and to X2.5.

It should be noted that a numerical relationship between the distances X3, x2.5, X2, X1.5, and X1 gradually decreases.

A main difference between the two embodiments mentioned above is that: the OCA adhesive in the prior art cannot be completely filled in an area between the adjacent two island structures 20, and the rigid substrate 410 has been stripped. Therefore, after the OCA adhesive is filled between the plurality of island structures 20, the distance between the adjacent two island structures 20 is changed from X1 to X2. However, the PDMS in the present application can be completely filled in an area between the adjacent two island structures 20, and the rigid substrate 410 is not stripped.

Therefore, after the PDMS is filled between the plurality of island structures 20, the distance between the adjacent two island structures 20 is changed from X1 to X1.5. In a final unstretched state, the distance between the adjacent two island structures 20 in the prior art is X3, while the distance between the adjacent two island structures 20 in the present application is X2.5. Assuming that an ultimate distance between the adjacent two island structures 20 in the present application and in the prior art is X4, a stretching ratio in the prior art is (X4–X3)/X3, while a stretching ratio in the present application is (X4–X2.5)/X2.5. Therefore, the technical scheme of the present application has certain improvement in the stretching ratio, increasing the stretching ratio of the flexible display panel 100.

In the embodiment, a range of the stretching ratio (X4–X3)/X3 in the prior art is about 5%. A formula of the stretching ratio of the embodiment is (X4–X2.5)/X2.5. Since X2.5 is less than X3, a range of the stretching ratio of the embodiments shown in FIGS. 8a to 8d can be greater than or equal to 10%.

Figure 9:
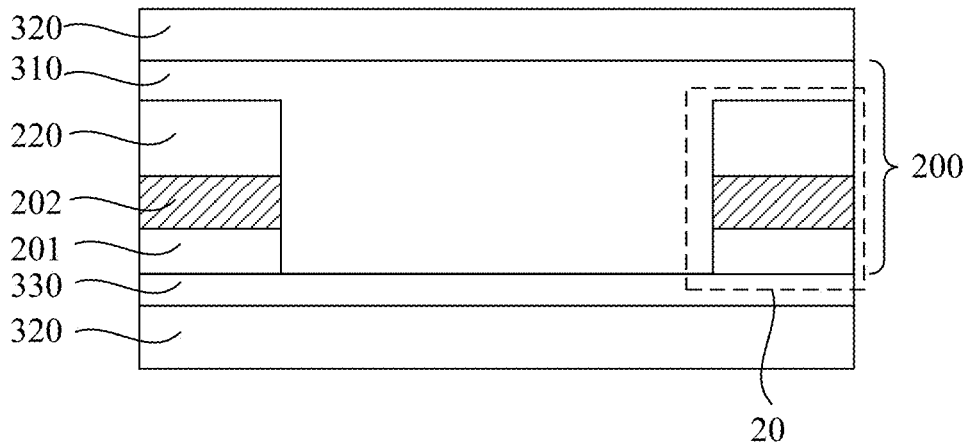
FIG. 9 is a second cross-sectional view of the section AA shown in FIG. 2 or FIG. 3.

Please refer to FIG. 9, FIG. 9 is a second cross-sectional view of the section AA shown in FIG. 2 or FIG. 3. Please refer to FIGS. 10a to 10d, FIGS. 10a to 10d are second process flow diagrams of the flexible display panel 100 in the present application.

In the flexible display panel 100 in the present application, a material of a first flexible adhesive layer 310 includes a thermoplastic hot melt adhesive. The thermoplastic hot melt adhesive includes resin, a tackifier, a viscosity modifier, or an antioxidant. The thermoplastic hot melt adhesive is solid at room temperature, while under heating conditions, the thermoplastic hot melt adhesive can be melted into liquid to form effective adhering to a surface of an object to be adhered. When the thermoplastic hot melt adhesive is cooled, it can be converted from liquid to solid. In this process, the thermoplastic hot melt adhesive has a certain property of shrinking, which can reduce the distance between the adjacent two island structures 20.

In the flexible display panel 100 of the present application, the flexible display panel 100 further includes a second flexible adhesive layer 320 arranged on either side of the flexible display panel 100. The second flexible adhesive layer 320 is adhered to a surface of a backlight side of the flexible display panel 100 through and adhesive layer, the adhesive layer is a first adhesive layer 330, and the second flexible adhesive layer 320 is directly adhered to the first flexible adhesive layer 310 on a surface of a light-emitting side of the flexible display panel 100.

In the embodiment, a material of the second flexible adhesive layer 320 may include PDMS.

In the embodiment, the first adhesive layer 330 may be an OCA adhesive.

Figure 10A:
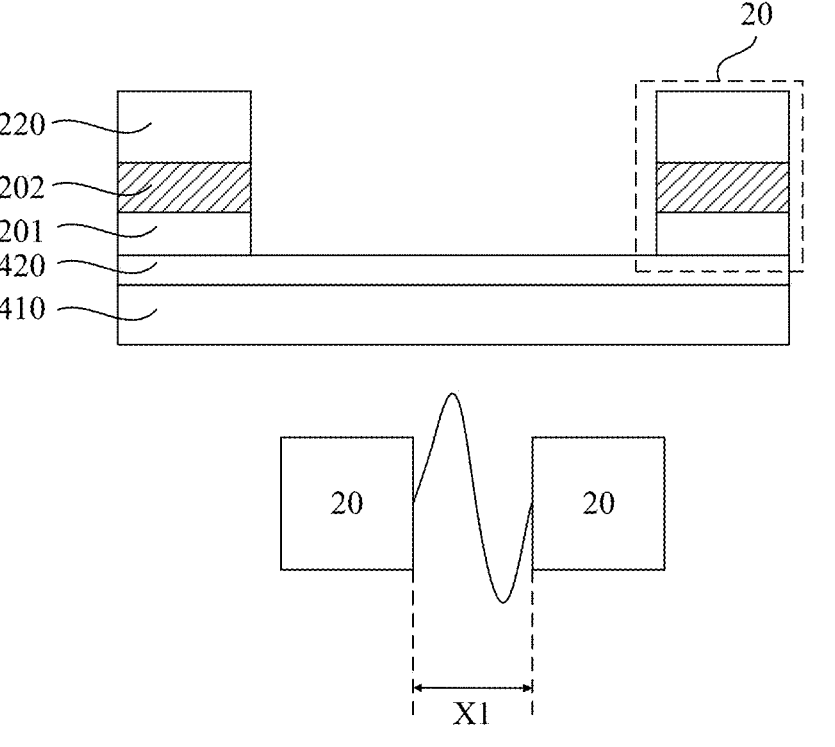
FIGS. 10a to 10d are second process flow diagrams of the flexible display panel in the present application.
Figure 10B:
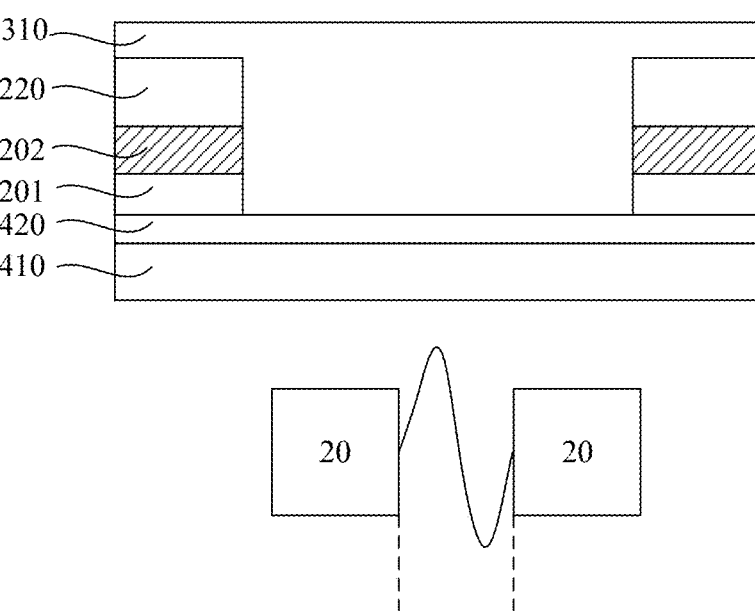
Figure 10B:
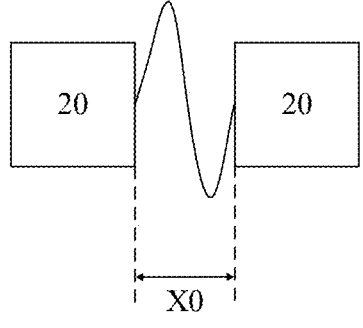
Figure 10C:
Figure 10D:
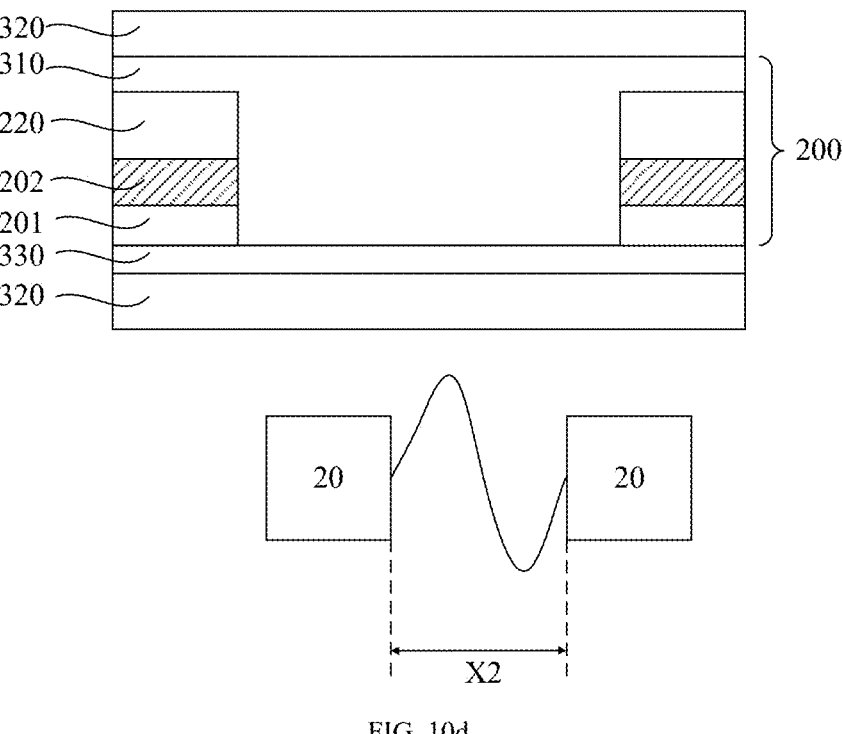

In FIG. 10a, forming a stripping layer 420 on a rigid substrate 410 and forming a plurality of island structures 20. In FIG. 10b, coating the thermoplastic hot melt adhesive between the plurality of island structures 20 and covering the plurality of island structures 20 with the thermoplastic hot melt adhesive. Since the rigid substrate 410 has not been stripped, a distance between adjacent two island structures 20 may be X1. In FIG. 10c, separating the structure of FIG. 10b from the rigid substrate 410. At a same time, thermoplasticity of the thermoplastic hot melt adhesive can reduce the distance between the adjacent two island structures 20, that is, the distance between the adjacent two island structures 20 in this step can be X0. In FIG. 10d, forming an OCA adhesive on a side of a structure of FIG. 10c facing away from a light-emitting direction to make the distance between the adjacent two island structures 20 be X1; at a same time, forming PDMS on either side of a flexible display body 200. Since the PDMS needs to be pressed for adhering, the distance between the adjacent two island structures 20 may be X2. Therefore, in a manufacturing process of the flexible display panel 100 of the present application, a PDMS layer is firstly formed between the plurality of island structures 20, then the flexible display body 200 is separated from the rigid substrate 410, and then the OCA and the PDMS are adhered. The distance between the adjacent two island structures 20 is changed from X1 to X0, and from X1 to X2.

It should be noted that a numerical relationship of the distances X3, X2.5, X2, X1.5, X1, and X0 gradually decreases.

It should be noted that the above-mentioned distance values are only an arrangement of values, not an arrangement of multiples.

A main difference between the above-mentioned two embodiments is that: the OCA adhesive cannot be completely filled in an area between the adjacent two island structures 20 in the prior art, and the rigid substrate 410 has been stripped. Therefore, after the OCA adhesive is filled between the plurality of island structures 20, the distance between the adjacent two island structures 20 is changed from X1 to X2.

The thermoplastic hot melt adhesive in the present application can be completely filled in the area between the adjacent two island structures 20, and the rigid substrate 410 has not been stripped. At a same time, due to the thermoplastic of the thermoplastic hot melt adhesive itself, the distance between the adjacent two island structures 20 can be limited. Therefore, after the thermoplastic hot melt adhesive is filled between the plurality of island structures 20, the distance between the adjacent two island structures 20 is changed from X1 to X0. In the final unstretched state, the distance between the adjacent two island structures 20 in the prior art is X3, while the distance between the adjacent two island structures 20 in the present application is X2. Assuming that the ultimate distance between the adjacent two island structures 20 in the present application and in the prior art is X4, the stretching ratio in the prior art is (X4-X3)/X3, while the stretching ratio in the present application is (X4-X2)/X2. Therefore, the technical scheme of the present application has certain improvement in the stretching ratio and increases the stretching ratio of the flexible display panel 100.

In the embodiment, the range of the stretching ratio (X4-X3)/X3 in the prior art is about 5%. The formula of the stretching ratio in the embodiment is (X4-X2)/X2. Since X2 is less than X2.5, the stretching ratio of the embodiments shown in FIGS. 10a to 10d is further increased compared with the embodiments shown in FIGS. 8a to 8d. The range of the stretching ratio of the embodiment can be less than or equal to 20%.

In addition, the adhesive filled in the embodiments shown in FIGS. 8a to 8d is PDMS, and the adhesive filled in the embodiments shown in FIGS. 10a to 10d is thermoplastic hot melt adhesive. Therefore, in the embodiment, a ratio of the PDMS and the thermoplastic hot melt adhesive can be adjusted to make the stretching ratio of the flexible display panel adjustable between 10% and 20% to meet requirements of different stretching ratios.

Figure 11:
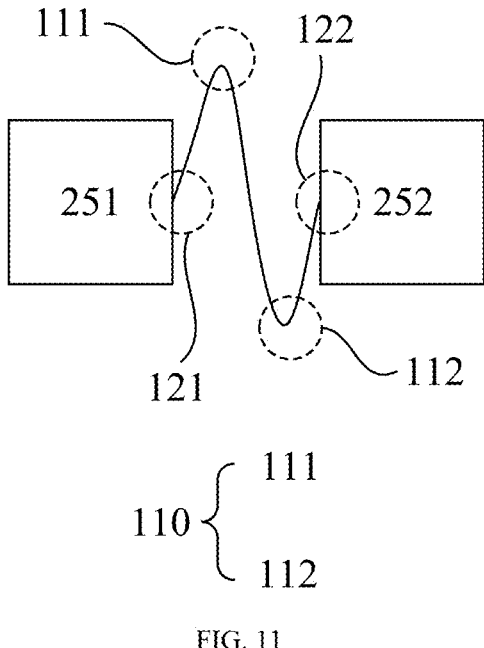
FIG. 11 is a sub-pixel arrangement diagram of a plurality of light-emitting units in the flexible display panel of the present application.

In the flexible display panel 100 of the present application, please refer to FIG. 11, the electrical connecting structures 10 may include a bending section 110, and a first connecting end 121 and a second connecting end 122 located at both sides of the bending section. The first connecting end 121 is connected to a first island structure 251, and the second connecting end 122 is connected to a second island structure 252. Widths of the metal lines of the connecting ends are greater than a width of the metal line of the bending section 110.

In the embodiment, since the distance between the adjacent two island structures 20 is reduced compared with the prior art, widths of the electrical connecting structures 10 connecting two island structures 20 needs to be reduced to prevent a risk of short connections.

In the flexible display panel 100 of the present application, the bending section 110 includes a first bending portion 111 and a second bending portion 112. A first end of the first bending portion 111 is electrically connected to the first connecting end 121. A first end of the second bending portion 112 is electrically connected to the second connecting end 122. A second end of the first bending portion 111 is electrically connected to a second end of the second bending portion 112. A bending direction of the first bending portion 111 is different from a bending direction of the second bending portion 112.

In the flexible display panel 100 of the present application, please refer to FIG. 12, the light-emitting units 220 may include a first color sub-pixel 41, a second color sub-pixel 42, and a third color sub-pixel 43 with different light-emitting colors, and light-emitting areas of the first color sub-pixel 41, the second color sub-pixel 42, and the third color sub-pixel 43 are equal.

In the embodiment, areas of sub-pixels of different colors may be set according to different arrangement of the first color sub-pixel 41, the second color sub-pixel 42, and the third color sub-pixel 43.

In the embodiment, a structural shape of the light-emitting unit 220 may include square, diamond, rectangular, circular, or polygonal, etc., which is not limited here.

Please refer to FIG. 13, a manufacturing method of the flexible display panel 100 is further provided in the present application, which comprises:

S10: forming a stripping layer 420 on a rigid substrate 410.

Please refer to FIG. 8a and FIG. 10a, the stripping layer 420 is mainly set to facilitate stripping of a flexible substrate 201 and the rigid substrate 410 in a later stage. For example, ultraviolet light irradiation is used to reduce adhesive force between the stripping layer 420 and the flexible substrate 201.

S20: forming a plurality of island structures 20 including a plurality of light-emitting units 220 on the stripping layer 420; the plurality of island structures 20 are arranged separately.

Please refer to FIG. 8a and FIG. 10a, the plurality of island structures 20 are formed on the stripping layer 410, and FIG. 5 and FIG. 6 may be referred to for specific structures.

S30: forming a first flexible adhesive layer 310 on the plurality of island structures 20 to form a flexible display body 200; the first flexible adhesive layer 310 is filled between the plurality of island structures 20, and the first flexible adhesive layer 310 covers the plurality of island structures 20.

Please refer to FIG. 8b, a material of the first flexible adhesive layer 310 may be PDMS. Please refer to FIG. 10b, the material of the first flexible adhesive layer 310 may be a thermoplastic hot melt adhesive.

S40: separating the flexible display body 200 from the stripping layer 420.

Please refer to FIG. 8c and FIG. 10c, the flexible display body 200 is separated from the stripping layer 420 by a stripping process, which can reduce adhesion of the stripping layer 420 by using ultraviolet light or the like.

S50: forming a second flexible adhesive layer 320 on either side of the flexible display body 200 to form a flexible display panel 100.

Please refer to FIG. 8d and FIG. 10d, the second flexible adhesive layer 320 is formed on both sides of the flexible display body 200; in FIG. 8d, the second flexible adhesive layer 320 on the both sides are adhered by an OCA adhesive. In FIG. 10d, the second flexible adhesive layer 320 on a light-emitting side can be directly adhered with the thermoplastic hot melt adhesive, and the second flexible adhesive layer 320 on a backlight side needs to be adhered through an OCA adhesive layer.

At a same time, due to differences in processes and materials, when the flexible display panel 100 is in an unstretched state, a distance between adjacent two island structures 20 is a first distance L1; when the flexible display panel 100 is in a stretched state, the distance between the adjacent two island structures 20 is a second distance L2. A ratio of a difference between the second distance L2 and the first distance L1 to the first distance L1 ranges from 10% to 20%.

A display terminal is further provided in the present application. The display terminal includes a terminal body and the flexible display panel mentioned above, and the terminal body and the flexible display panel are combined into a whole. An operating principle of the display terminal is similar to an operating principle of the flexible display panel. The display terminal may include mobile phones, tablet computers, computer monitors, game consoles, televisions, display screens, wearable devices, and other living appliances or household appliances or the like with display functions, which is not limited here.

It can be understood that for those skilled in the art, equivalent replacement or change can be made according to the technical scheme and an inventive concept of the present application, and all these changes or replacements should belong to a protection scope of the claims attached to the present application.

What is claimed is:

1. A flexible display panel, comprising:
   a plurality of island structures comprising a plurality of light emitting units, and the plurality of island structures arranged separately;
   a plurality of electrical connecting structures, the electrical connecting structures comprising metal lines electrically connected to the light-emitting units; wherein adjacent ones of the island structures are stretched and connected through the plurality of electrical connecting structures; and
   a first flexible adhesive layer filled between the plurality of island structures, and the first flexible adhesive layer covering the plurality of island structures and made of a thermoplastic hot melt adhesive that is solid at room temperature while is liquid under heating conditions;
   wherein when the flexible display panel is in an unstretched state, a distance between adjacent two of the island structures is a first distance, and the first distance is a minimum shrinking distance of the adjacent two of the island structures; when the flexible display panel is in a stretched state, the distance between the adjacent two of the island structures is a second distance, and the second distance is a maximum stretching distance of the adjacent two of the island structures; and a ratio of a difference between the second distance and the first distance to the first distance ranges from 10% to 20%, and each of the electrical connecting structures comprises a bending section, and a first connecting end and a second connecting end located at both sides of the bending section; the first connecting end is connected to a first island structure, and the second connecting end is connected to a second island structure, and widths of the metal lines of the first connecting end and the second connecting end are greater than a width of the metal line of the bending section.

2. The flexible display panel as claimed in claim 1, wherein the thermoplastic hot melt adhesive comprises resin, a tackifier, a viscosity modifier, or an antioxidant, and wherein when the thermoplastic hot melt adhesive is converted from liquid to solid, the thermoplastic hot melt adhesive is shrunk to reduce the distance between the adjacent two of the island structures.

3. The flexible display panel as claimed in claim 2, wherein the flexible display panel further comprises:

an adhesive layer adhered to a backlight side of the flexible display panel; and a second flexible adhesive layer arranged on either side of the flexible display panel, and the second flexible adhesive layer is adhered to a surface of the backlight side of the flexible display panel through the first adhesive layer, and the second flexible adhesive layer is directly adhered to the first flexible adhesive layer on a surface of a light-emitting side of the flexible display panel;

wherein a material of the second flexible adhesive layer comprises polydimethylsiloxane.

4. The flexible display panel as claimed in claim 1, wherein the island structures comprise:

a flexible substrate;

an array driving layer arranged on the flexible substrate; and a light-emitting functional layer arranged on the array driving layer, the light-emitting functional layer comprising the plurality of light-emitting units, and the light-emitting units electrically connected to a source electrode or a drain electrode of the array driving layer.

5. The flexible display panel as claimed in claim 1, wherein the bending section comprises:

a first bending portion, a first end of the first bending portion is electrically connected to the first connecting end; and a second bending portion, a first end of the second bending portion is electrically connected to the second connecting end, and a second end of the first bending portion is electrically connected to a second end of the second bending portion;

wherein a bending direction of the first bending portion is different from a bending direction of the second bending portion.

6. The flexible display panel as claimed in claim 1, wherein the flexible display panel further comprises:

a first adhesive layer adhered to a backlight side of the flexible display panel;

a second adhesive layer adhered to a light-emitting side of the flexible display panel; and a second flexible adhesive layer arranged on either side of the flexible display panel, and the second flexible adhesive layer is adhered to a surface of the backlight side of the flexible display panel through the first adhesive layer, and the second flexible adhesive layer is adhered to a surface of the light-emitting side of the flexible display panel through the second adhesive layer;

wherein a material of the second flexible adhesive layer is same as the material of the first flexible adhesive layer.

7. The flexible display panel as claimed in claim 1, wherein the light-emitting units comprise a first color sub-pixel, a second color sub-pixel, and a third color sub-pixel with different light-emitting colors, and light-emitting areas of the first color sub-pixel, the second color sub-pixel, and the third color sub-pixel are equal.

8. A manufacturing method of a flexible display panel, comprising:

forming a stripping layer on a rigid substrate;

forming a plurality of island structures comprising a plurality of light-emitting units on the stripping layer; the plurality of island structures are arranged separately;

forming a first flexible adhesive layer on the plurality of island structures to form a flexible display body; wherein the first flexible adhesive layer is filled between the plurality of island structures, and the first flexible adhesive layer covers the plurality of island structures and is made of a thermoplastic hot melt adhesive that is solid at room temperature while is liquid under heating conditions;

separating the flexible display body from the stripping layer; and forming a second flexible adhesive layer on either side of the flexible display body to form the flexible display panel;

wherein when the flexible display panel is in an unstretched state, a distance between adjacent two of the island structures is a first distance, and the first distance is a minimum shrinking distance of the adjacent two of the island structures; when the flexible display panel is in a stretched state, the distance between the adjacent two of the island structures is a second distance, and the second distance is a maximum stretching distance of the adjacent two of the island structures; a ratio of a difference between the second distance and the first distance to the first distance ranges from 10% to 20%, and each of the electrical connecting structures comprises a bending section, and a first connecting end and a second connecting end located at both sides of the bending section; the first connecting end is connected to a first island structure, and the second connecting end is connected to a second island structure, and widths of the metal lines of the first connecting end and the second connecting end are greater than a width of the metal line of the bending section.

9. A display terminal, wherein the display terminal comprises a terminal body and a flexible display panel, the terminal body and the flexible display panel are combined into a whole, and the flexible display panel comprises:

a plurality of island structures comprising a plurality of light emitting units, and the plurality of island structures arranged separately;

a plurality of electrical connecting structures, the electrical connecting structures comprising metal lines electrically connected to the light-emitting units; adjacent ones of the island structures are stretched and connected through the plurality of electrical connecting structures; and a first flexible adhesive layer filled between the plurality of island structures, and the first flexible adhesive layer covering the plurality of island structures and made of a thermoplastic hot melt adhesive that is solid at room temperature while is liquid under heating conditions;

wherein when the flexible display panel is in an unstretched state, a distance between adjacent two of the island structures is a first distance, and the first distance is a minimum shrinking distance of the adjacent two of the island structures; when the flexible display panel is in a stretched state, the distance between the adjacent two of the island structures is a second distance, and the second distance is a maximum stretching distance of the adjacent two of the island structures; and a ratio of a difference between the second distance and the first distance to the first distance ranges from 10% to 20%, and each of the electrical connecting structures comprises a bending section, and a first connecting end and a second connecting end located at both sides of the bending section; the first connecting end is connected to a first island structure, and the second connecting end is connected to a second island structure, and widths of the metal lines of the first connecting end and the second connecting end are greater than a width of the metal line of the bending section.

10. The display terminal as claimed in claim 9, wherein the bending section comprises:

a first bending portion, a first end of the first bending portion is electrically connected to the first connecting end; and a second bending portion, a first end of the second bending portion is electrically connected to the second connecting end, and a second end of the first bending portion is electrically connected to a second end of the second bending portion;

wherein a bending direction of the first bending portion is different from a bending direction of the second bending portion.

11. The display terminal as claimed in claim 9, wherein the flexible display panel further comprises:

a first adhesive layer adhered to a backlight side of the flexible display panel;

a second adhesive layer adhered to a light-emitting side of the flexible display panel; and a second flexible adhesive layer arranged on either side of the flexible display panel, and the second flexible adhesive layer is adhered to a surface of the backlight side of the flexible display panel through the first adhesive layer, and the second flexible adhesive layer is adhered to a surface of the light-emitting side of the flexible display panel through the second adhesive layer;

wherein a material of the second flexible adhesive layer is same as the material of the first flexible adhesive layer.

12. The display terminal as claimed in claim 9, wherein the thermoplastic hot melt adhesive comprises resin, a tackifier, a viscosity modifier, or an antioxidant, and wherein when the thermoplastic hot melt adhesive is converted from liquid to solid, the thermoplastic hot melt adhesive is shrunk to reduce the distance between the adjacent two of the island structures.

13. The display terminal as claimed in claim 12, wherein the flexible display panel further comprises:

an adhesive layer adhered to a backlight side of the flexible display panel; and a second flexible adhesive layer arranged on either side of the flexible display panel, and the second flexible adhesive layer is adhered to a surface of the backlight side of the flexible display panel through the first adhesive layer, and the second flexible adhesive layer is directly adhered to the first flexible adhesive layer on a surface of a light-emitting side of the flexible display panel wherein a material of the second flexible adhesive layer comprises polydimethylsiloxane.

14. The display terminal as claimed in claim 9, wherein the island structures comprise:

a flexible substrate;

an array driving layer arranged on the flexible substrate; and a light-emitting functional layer arranged on the array driving layer, the light-emitting functional layer comprising the plurality of light-emitting units, and the light-emitting units electrically connected to a source electrode or a drain electrode of the array driving layer.

15. The display terminal as claimed in claim 9, wherein the light-emitting units comprise a first color sub-pixel, a second color sub-pixel, and a third color sub-pixel with different light-emitting colors, and light-emitting areas of the first color sub-pixel, the second color sub-pixel, and the third color sub-pixel are equal.

16. The display terminal as claimed in claim 9, wherein a structural shape of the light-emitting units is one of square, diamond, rectangular, circular, or polygonal.

* * * * *